(12) United States Patent
Kim et al.

(10) Patent No.: US 11,908,863 B2
(45) Date of Patent: Feb. 20, 2024

(54) TRANSISTOR ELEMENT, TERNARY INVERTER APPARATUS COMPRISING SAME, AND METHOD FOR PRODUCING SAME

(71) Applicant: UNIST(ULSAN NATIONAL INSTITUTE OF SCIENCE AND TECHNOLOGY), Ulsan (KR)

(72) Inventors: Kyung Rok Kim, Ulsan (KR); Jae Won Jeong, Seoul (KR); Young Eun Choi, Ulsan (KR); Woo Seok Kim, Daegu (KR); Jiwon Chang, Ulsan (KR)

(73) Assignee: UNIST(ULSAN NATIONAL INSTITUTE OF SCIENCE AND TECHNOLOGY) (KR)

( * ) Notice: Subject to any disclaimer, the term of this patent is extended or adjusted under 35 U.S.C. 154(b) by 268 days.

(21) Appl. No.: 17/419,700

(22) PCT Filed: Dec. 16, 2019

(86) PCT No.: PCT/KR2019/017785
§ 371 (c)(1),
(2) Date: Jun. 29, 2021

(87) PCT Pub. No.: WO2020/141758
PCT Pub. Date: Jul. 9, 2020

(65) Prior Publication Data
US 2022/0085015 A1 Mar. 17, 2022

(30) Foreign Application Priority Data

Dec. 31, 2018 (KR) .................. 10-2018-0174231
Jul. 5, 2019 (KR) .................. 10-2019-0081520

(51) Int. Cl.
*H01L 27/092* (2006.01)
*H01L 29/66* (2006.01)
*H01L 29/78* (2006.01)

(52) U.S. Cl.
CPC .... *H01L 27/0924* (2013.01); *H01L 29/66492* (2013.01); *H01L 29/7833* (2013.01)

(58) Field of Classification Search
CPC .......... H01L 27/0924; H01L 29/66492; H01L 29/7833; H01L 29/7851; H01L 29/66803; H01L 21/8238; H01L 27/092; H01L 29/10
See application file for complete search history.

(56) References Cited

U.S. PATENT DOCUMENTS 9,455,346 B2 * 9/2016 Wu .................. H01L 29/785
9,881,918 B1 * 1/2018 Huang ............... H01L 21/324
(Continued)

FOREIGN PATENT DOCUMENTS

JP 2005005621 1/2005
JP 2007258485 10/2007
(Continued)

OTHER PUBLICATIONS

International Search Report and Written Opinion for PCT/KR2019/017785, dated Apr. 17, 2020 (w/English ISR).
(Continued)

*Primary Examiner* — Fernando L Toledo
*Assistant Examiner* — Adam S Bowen
(74) *Attorney, Agent, or Firm* — Klarquist Sparkman, LLP

(57) ABSTRACT

A transistor device includes a substrate, a fin structure extending on the substrate in a direction parallel to a top surface of the substrate, a source region and a drain region provided at an upper portion of the fin structure, a constant
(Continued)

current generating layer provided at a lower portion of the fin structure, a gate insulating film provided on both side surfaces and a top surface of the upper portion of the fin structure, and a gate electrode provided on the gate insulating film, wherein the gate electrode is provided on the fin structure and between the source region and the drain region, the constant current generating layer generates a constant current between the drain region and the substrate, and the constant current is independent from a gate voltage applied to the gate electrode.

13 Claims, 15 Drawing Sheets

(56) References Cited

U.S. PATENT DOCUMENTS

| | | | |
|---|---|---|---|
| 9,985,133 | B2 | 5/2018 | Jangjian et al. |
| 10,157,995 | B2 * | 12/2018 | Wang ................. H01L 21/28518 |
| 2006/0138476 | A1 | 6/2006 | Nishimuta et al. |
| 2007/0221956 | A1 | 9/2007 | Inaba |
| 2015/0179800 | A1 | 6/2015 | Biswas et al. |
| 2015/0294879 | A1 * | 10/2015 | Zhu ....................... H01L 21/845 |
| | | | 438/692 |
| 2015/0295070 | A1 * | 10/2015 | Zhu ................... H01L 29/66795 |
| | | | 257/192 |
| 2015/0303192 | A1 * | 10/2015 | Zhu ....................... H01L 29/161 |
| | | | 438/283 |
| 2015/0303274 | A1 * | 10/2015 | Zhu ..................... H01L 29/6681 |
| | | | 438/283 |
| 2015/0311123 | A1 * | 10/2015 | Zhu ................... H01L 29/66545 |
| | | | 438/283 |
| 2015/0318349 | A1 * | 11/2015 | Zhu ....................... H01L 29/401 |
| | | | 257/397 |
| 2015/0318396 | A1 * | 11/2015 | Zhu ................... H01L 21/31111 |
| | | | 257/192 |
| 2015/0318397 | A1 * | 11/2015 | Zhu ..................... H01L 21/0257 |
| | | | 257/192 |
| 2015/0325699 | A1 * | 11/2015 | Zhu ................... H01L 29/66795 |
| | | | 257/192 |
| 2016/0190142 | A1 | 6/2016 | Kim et al. |
| 2017/0012100 | A1 * | 1/2017 | Leobandung ... H01L 21/823481 |
| 2018/0337173 | A1 * | 11/2018 | Tsai ................... H01L 29/66803 |
| 2019/0165143 | A1 * | 5/2019 | More ................ H01L 29/66795 |
| 2019/0273014 | A1 | 9/2019 | Tsai et al. |
| 2019/0386118 | A1 * | 12/2019 | Chan ................... H01L 29/7834 |

FOREIGN PATENT DOCUMENTS

| | | |
|---|---|---|
| KR | 20010016838 A | 3/2001 |
| KR | 20140145667 A | 12/2014 |
| KR | 20150073119 A | 6/2015 |
| KR | 20160086732 A | 7/2016 |

OTHER PUBLICATIONS

Notice of Allowance for Korean Patent Application No. 10-2019-0081520, dated May 18, 2021, 2020 (w/English translation).

Office Action for Korean Application No. 10-2019-0081520, dated Jul. 14, 2020 (w/English translation).

Office Action for Korean Application No. 10-2019-0081520, dated Jan. 26, 2021(w/English translation).

* cited by examiner

TRANSISTOR ELEMENT, TERNARY INVERTER APPARATUS COMPRISING SAME, AND METHOD FOR PRODUCING SAME

CROSS REFERENCE TO RELATED APPLICATIONS

This is the U.S. National Stage of International Application No. PCT/KR2019/017785, filed Dec. 16, 2019, which in turn claims priority to Korean Patent Application No. 10-2018-0174231, filed Dec. 31, 2018, and Korean Patent Application No. 10-2019-0081520, filed Jul. 5, 2019, which applications are incorporated herein in their entireties.

TECHNICAL FIELD

The present disclosure relates to a transistor device, a ternary inverter device including the same, and a method of manufacturing the same.

BACKGROUND ART

In order to rapidly process a large amount of data, conventional binary logic-based digital systems have focused on increasing the bit density through the miniaturization of an CMOS device. However, with the recent integration to less than 30-nm, there was a limitation in increasing the bit density due to the increase in leakage current and power consumption due to the quantum tunneling effect. In order to overcome the limitation of the bit density, interest in a ternary logic device and a circuit, which are one of multi-valued logics, is rapidly increasing, and in particular, development of a standard ternary inverter (STI) as a basic unit for implementing a ternary logic has been actively carried out. However, unlike conventional binary inverters using two CMOS's with a single voltage source, there is an issue that the conventional techniques regarding STI require more voltage sources or a complicated circuit configuration.

DESCRIPTION OF EMBODIMENTS

Technical Problem

An object to be solved is to provide a transistor device having a constant current independent from a gate voltage.

An object to be solved is to provide a ternary inverter device having a constant current independent from an input voltage.

An object to be solved is to provide a method of manufacturing a transistor device having a constant current independent from a gate voltage.

However, the objects to be solved are not limited to those disclosed above.

Solution to Problem

According to an aspect, a transistor device including: a substrate; a fin structure extending on the substrate in a direction parallel to a top surface of the substrate; a source region and a drain region provided at an upper portion of the fin structure; a constant current generating layer provided at a lower portion of the fin structure; a gate insulating film provided on both side surfaces and a top surface of the upper portion of the fin structure; and a gate electrode provided on the gate insulating film, wherein the gate electrode is provided on the fin structure and between the source region and the drain region, the constant current generating layer generates a constant current between the drain region and the substrate, and the constant current is independent from a gate voltage applied to the gate electrode, may be provided.

The constant current generating layer may be electrically connected to a lower portion of the source region and a lower portion of the drain region.

The constant current generating layer may directly contact a bottom surface of the source region and a bottom surface of the drain region.

The substrate and the constant current generating layer may have a first conductivity type, and the source region and the drain region may have a second conductivity type that is different from the first conductivity type.

The doping concentration of the constant current generating layer may be $3 \times 10^{18}$ cm$^{-3}$ or greater.

An electric field may be formed between the drain region and the constant current generating layer, and an intensity of the electric field may be $10^6$ V/cm or greater.

According to an aspect, a ternary inverter device including: an NMOS transistor device; and a PMOS transistor device, wherein each of the NMOS transistor device and the PMOS transistor device comprises: a substrate; a fin structure extending on the substrate in a direction parallel to a top surface of the substrate; a source region and a drain region provided at an upper portion of the fin structure; a constant current generating layer provided under the fin structure, wherein the constant current generating layer directly contacts a lower portion of the source region and a lower portion of the drain region, and generates a constant current between the drain region and the substrate, and the drain region of the NMOS transistor device and the drain region of the PMOS transistor device have identical voltages, may be provided.

Each of the NMOS transistor device and the PMOS transistor device may further include: a gate insulating film provided on both side surfaces and a top surface of the upper portion of the fin structure; and a gate electrode provided on the gate insulating film, wherein the constant current may be independent from a gate voltage applied to the gate electrode.

The drain region of the NMOS transistor device and the drain region of the PMOS transistor device may have a first voltage when the NMOS transistor device has a channel current that is stronger than the constant current and the PMOS transistor device has the constant current that is stronger than a channel current, have a second voltage when the NMOS transistor device has the constant current that is stronger than the channel current and the PMOS transistor device has the channel current that is stronger than the constant current, and have a third voltage when each of the NMOS transistor device and the PMOS transistor device has the constant current that is stronger than the channel current, and the second voltage may be greater than the first voltage, and the third voltage may have a value between the first voltage and the second voltage.

In each of the NMOS transistor device and the PMOS transistor device, the substrate and the constant current generating layer may have conductivity types identical to each other, and a doping concentration of the constant current generating layer may be greater than a doping concentration of the substrate.

In each of the NMOS transistor device and the PMOS transistor device, a doping concentration of the constant current generating layer may be $3 \times 10^{18}$ cm$^{-3}$ or greater.

According to an aspect, a method of manufacturing a transistor device including: forming, on a substrate, a fin structure extending in a first direction; forming a constant current generating layer at a lower portion of the fin structure; forming, on the substrate, a gate electrode extending in a second direction that intersects the first direction; forming a gate insulating film between the gate electrode and the fin structure; and forming, on the fin structure, a source region and a drain region that are spaced apart from each other in the first direction, wherein the constant current generating layer has a conductivity type identical to a conductivity type of the substrate, and the source region and the drain region are spaced apart from each other with the gate electrode therebetween, may be provided.

The forming of the constant current generating layer may include: forming a pair of impurity films on both sides of the lower portion of the fin structure, respectively; and heat-treating the pair of impurity films.

The pair of impurity films may include a boron silicate glass (BSG) film or a phosphorus silicate glass (PSG) film.

The forming of the constant current generating layer may include: implanting an impurity into the lower portion of the fin structure by using an ion implantation process.

Advantageous Effects of Disclosure

The present disclosure may provide a transistor device having a constant current independent from a gate voltage.

The present disclosure may provide a ternary inverter device having a constant current independent from an input voltage.

The present disclosure may provide a method of manufacturing a transistor device having a constant current independent from a gate voltage.

However, the effects are not limited to those disclosed above.

MODE OF DISCLOSURE

Figure 1:
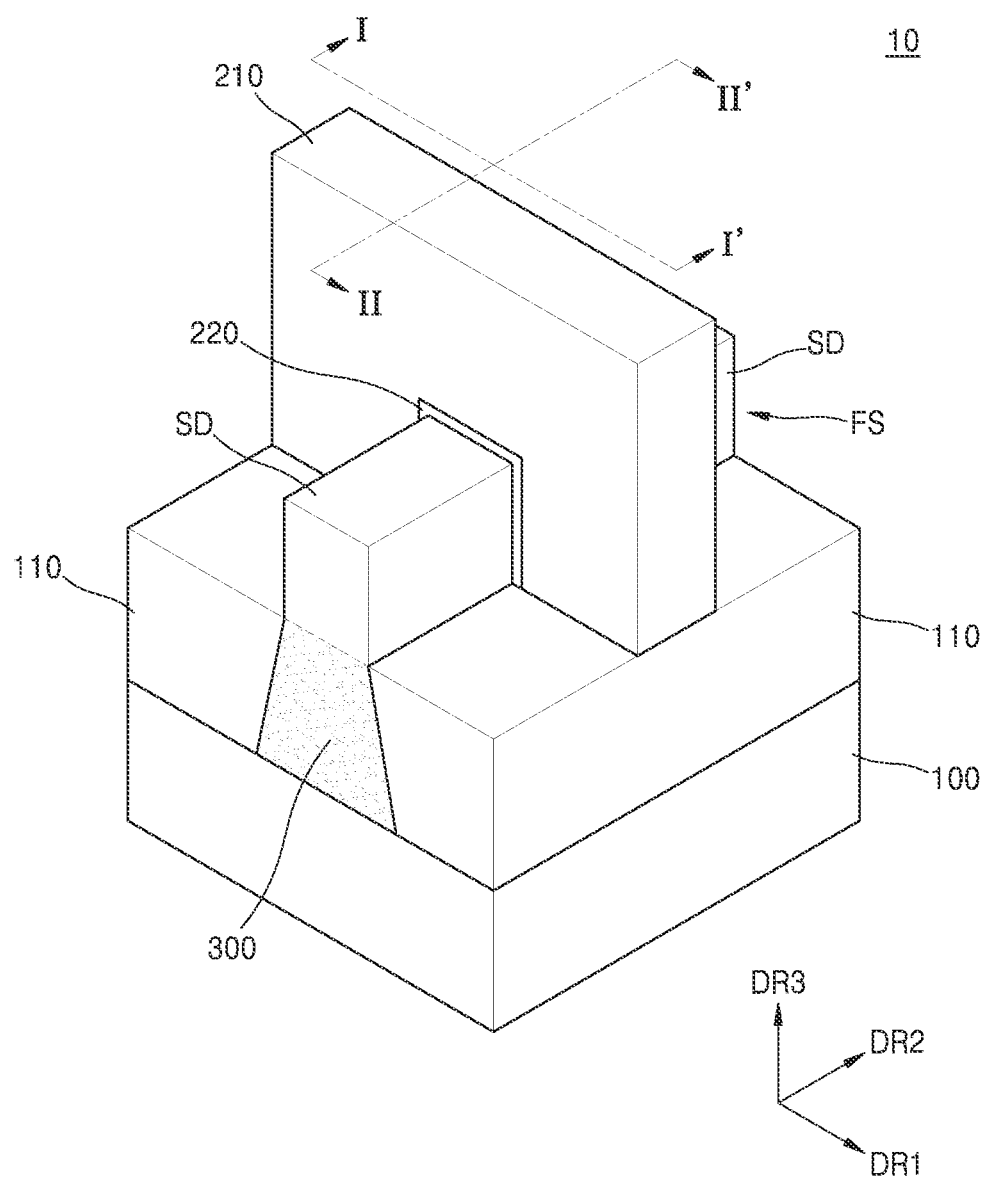
FIG. 1 is a perspective view of a transistor device according to example embodiments.

Hereinafter, embodiments of the present disclosure will be described in detail with reference to the accompanying drawings. In the following drawings, like reference numerals refer to like elements, and sizes of elements in the drawings may be exaggerated for clarity and convenience of description. Meanwhile, the following embodiments are merely illustrative, and various modifications may be made from these embodiments.

Hereinafter, an expression "above" or "on" used herein may include not only "immediately on in a contact manner" but also "on in a non-contact manner".

An expression used in the singular encompasses the expression of the plural, unless it has a clearly different meaning in the context. In addition, when an element "includes" an element, unless there is a particular description contrary thereto, the element may further include other elements, not excluding the other elements.

Also, the terms described in the specification, such as " . . . er (or)", " . . . unit", etc., denote a unit that performs at least one function or operation, which may be implemented as hardware or software or a combination thereof.

Figure 2:
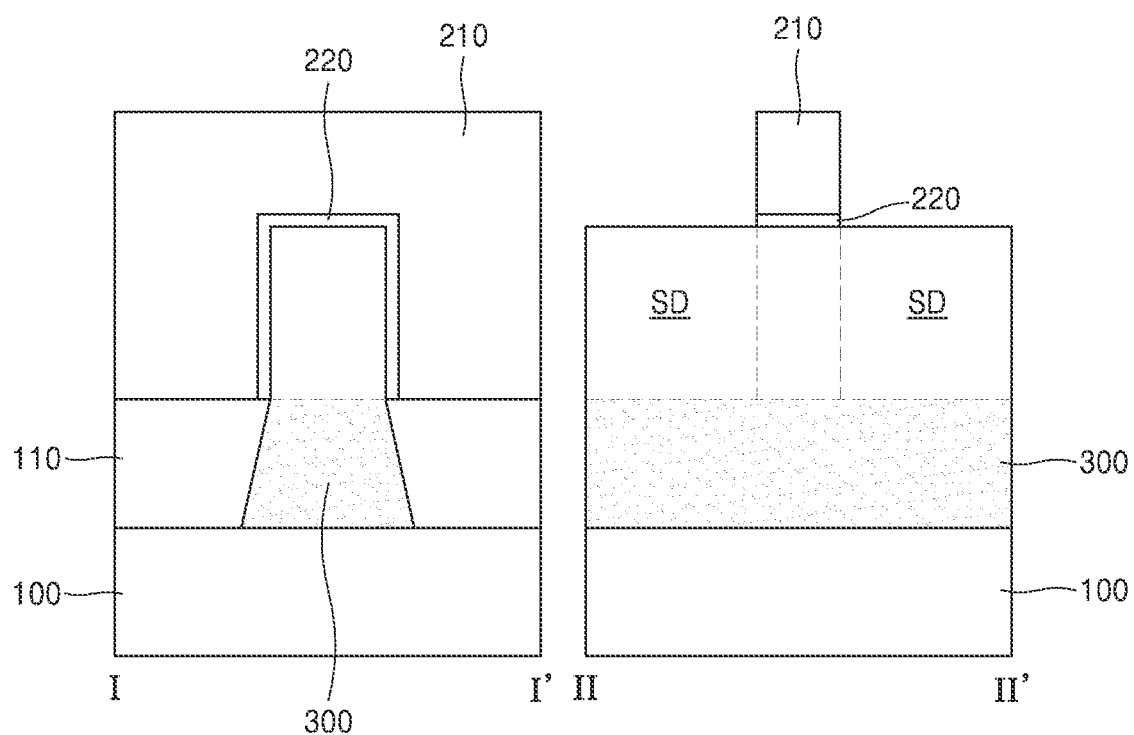
FIG. 2 is a cross-sectional view taken along lines I-I' and II-II' of the transistor device of FIG. 1.

FIG. 1 is a perspective view of a transistor device according to example embodiments. FIG. 2 is a cross-sectional view taken along lines I-I' and II-II' of the transistor device of FIG. 1.

Referring to FIGS. 1 and 2, a transistor device 10 may be provided. The transistor device 10 may include a substrate 100, a fin structure FS, a pair of lower insulating films 110, a gate electrode 210, and a gate insulating films 220.

The substrate 100 may be a semiconductor substrate. For example, the substrate 100 may be a silicon (Si) substrate, a germanium (Ge) substrate, or a silicon-germanium (SiGe) substrate. The substrate 100 may have a first conductivity type. For example, the first conductivity type may be n-type or p-type. In the case where the conductivity type of the substrate 100 is n-type, the substrate 100 may include a group V element (e.g., P, As) as an impurity. In the case where the conductivity type of the substrate 100 is p-type, the substrate 100 may include a group III element (e.g., B, In) as an impurity.

The fin structure FS may be provided on the substrate 100. The fin structure FS may extend in a second direction DR2 parallel to the top surface of the substrate 100. The fin structure FS may protrude from the top surface of the substrate 100. The fin structure FS may include a semiconductor material. For example, the fin structure FS may include silicon (Si), germanium (Ge), or silicon germanium (SiGe).

The fin structure FS may include a pair of source/drain regions SD and a constant current generating layer 300. The pair of source/drain regions SD spaced apart from each other in the second direction DR2 may be provided on the fin structure FS. One of the pair of source/drain regions SD may be a source of the transistor device. The other one of the pair of source/drain regions SD may be a drain of the transistor device. The pair of source/drain regions SD may have a second conductivity type different from the first conductivity type. In the case where the first conductivity type is n-type, the second conductivity type may be p-type. In the case where the conductivity type of the pair of source/drain regions SD is p-type, the pair of source/drain regions SD may include a group III element (e.g., B, In) as an impurity. In the case where the first conductivity type is p-type, the second conductivity type may be n-type. In the case where the conductivity type of the pair of source/drain regions SD is n-type, the pair of source/drain regions SD may include a group V element (e.g., P, As) as an impurity.

The constant current generating layer 300 may be provided under the fin structure FS. The constant current generating layer 300 may be provided between the pair of source/drain regions SD and the substrate 100. The constant current generating layer 300 may be electrically connected to the pair of source/drain regions SD. For example, the constant current generating layer 300 may directly contact bottom surfaces of the pair of source/drain regions SD. The constant current generating layer 300 may extend in the second direction DR2. The constant current generating layer 300 may have the first conductivity type. In the case where the conductivity type of the constant current generating layer 300 is n-type, the constant current generating layer 300 may include a group V element (e.g., P, As) as an impurity. In the case where the conductivity type of the constant current generating layer 300 is p-type, the constant current generating layer 300 may include a group III element (e.g., B, In) as an impurity. A doping concentration of the constant current generating layer 300 may be greater than a doping concentration of the substrate 100. For example, the doping concentration of the constant current generating layer 300 may be $3 \times 10^{18}$ cm$^{-3}$ or greater. An electric field may be formed between the constant current generating layer 300 and the pair of source/drain regions SD. For example, the intensity of the electric field may be $10^6$ V/cm or greater.

The constant current generating layer 300 may generate a constant current between the source/drain region SD, which is the drain of the transistor device, among the pair of source/drain regions SD, and the substrate 100. The constant current may be a band-to-band tunneling (BTBT) current between the source/drain region SD, which is the drain, and the constant current generating layer 300. The constant current may be independent from a gate voltage applied to the gate electrode 210. That is, the constant current may flow regardless of the gate voltage. In the case where the transistor device 10 is an NMOS transistor device, the constant current may flow from the source/drain region SD, which is the drain, to the substrate 100 via the constant current generating layer 300. In the case where the transistor device 10 is a PMOS transistor device, the constant current may flow from the substrate 100 to the source/drain region SD, which is the drain, via the constant current generating layer 300.

The pair of lower insulating films 110 may be spaced apart from each other with the fin structure FS therebetween. The pair of lower insulating films 110 may be arranged in a first direction DR1 parallel to the top surface of the substrate 100 and intersecting the second direction DR2. The pair of lower insulating films 110 may overlap a lower portion of the fin structure FS in the first direction DR1. The pair of lower insulating films 110 may cover both side surfaces of the constant current generating layer 300. The pair of lower insulating films 110 may expose the pair of source/drain regions SD. In other words, the pair of source/drain regions SD may protrude from the pair of lower insulating films 110. The pair of lower insulating films 110 may include an electrically insulating material. For example, the pair of lower insulating films 110 may include $SiO_2$ or a high-k dielectric material (e.g., SiON, $HfO_2$, $ZrO_2$).

The gate electrode 210 may be provided on the fin structure FS and the pair of lower insulating films 110. The gate electrode 210 may extend in the first direction DR1. When viewed from a plan view, the gate electrode 210 may intersect the fin structure FS. Hereinafter, the plan view is a view of the transistor device 10 in a direction opposite to a third direction DR3. When viewed from the plan view, the gate electrode 210 may be provided between the pair of source/drain regions SD. The gate electrode 210 may include an electrically conductive material. For example, the gate electrode may include a metal (e.g., Cu) or doped polysilicon (doped-poly Si).

The gate insulating film 220 may be provided between the gate electrode 210 and the fin structure FS. For example, the gate insulating film 220 may conformally cover an upper portion of the fin structure FS. The gate insulating film 220 may electrically insulate the gate electrode 210 and the fin structure FS from each other. The gate insulating film 220 may separate the gate electrode 210 and the fin structure FS from each other. The gate insulating film 220 may include an electrically insulating material. For example, the gate insulating film 220 may include $SiO_2$ or a high-k dielectric material (e.g., SiON, $HfO_2$, $ZrO_2$).

The present disclosure may provide the transistor device 10 in which a constant current flows between the source/drain region SD, which is the drain, and the substrate 100.

Figure 3:
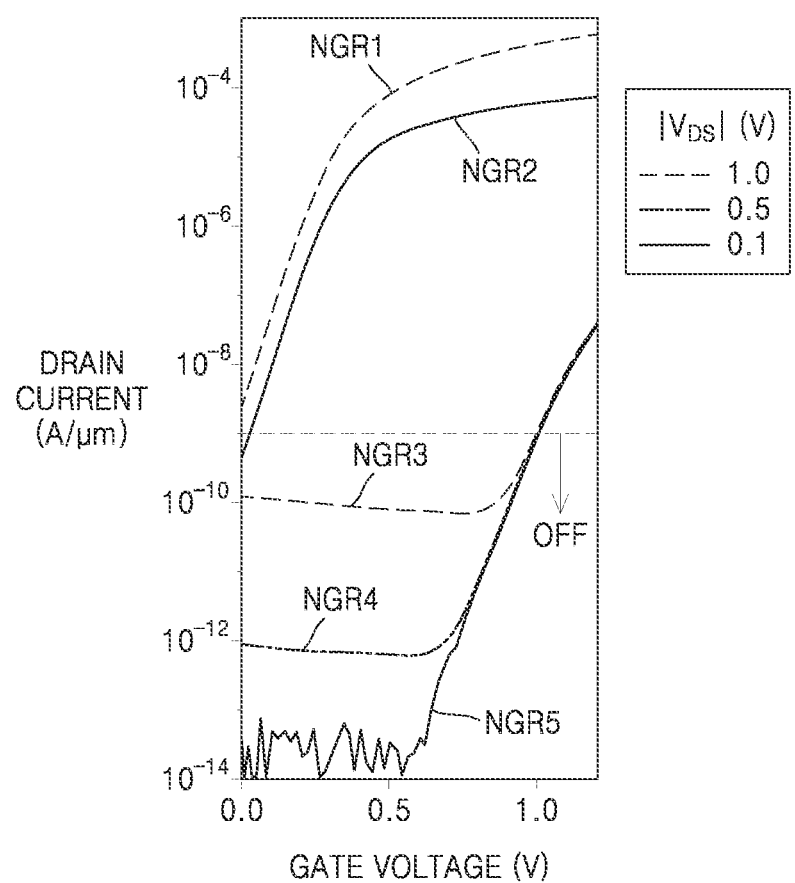
FIG. 3 shows gate voltage-drain current graphs of NMOS transistor devices according to the present disclosure and conventional NMOS transistor devices.

FIG. 3 shows gate voltage-drain current graphs of NMOS transistor devices according to the present disclosure and conventional NMOS transistor devices.

Referring to FIG. 3, gate voltage-drain current graphs NGR1 and NGR2 of the conventional NMOS transistor devices and gate voltage-drain current graphs NGR3, NGR4, and NGR5 of the NMOS transistor devices according to the present disclosure are illustrated.

Drain currents of the conventional NMOS transistor devices did not have a constant current component flowing regardless of a gate voltage.

Drain currents of the NMOS transistor devices of the present disclosure had a constant current component flowing regardless of a gate voltage. For example, even when the NMOS transistor devices of the present disclosure had an off state, a constant current flowed through the NMOS transistor devices of the present disclosure.

Figure 4:
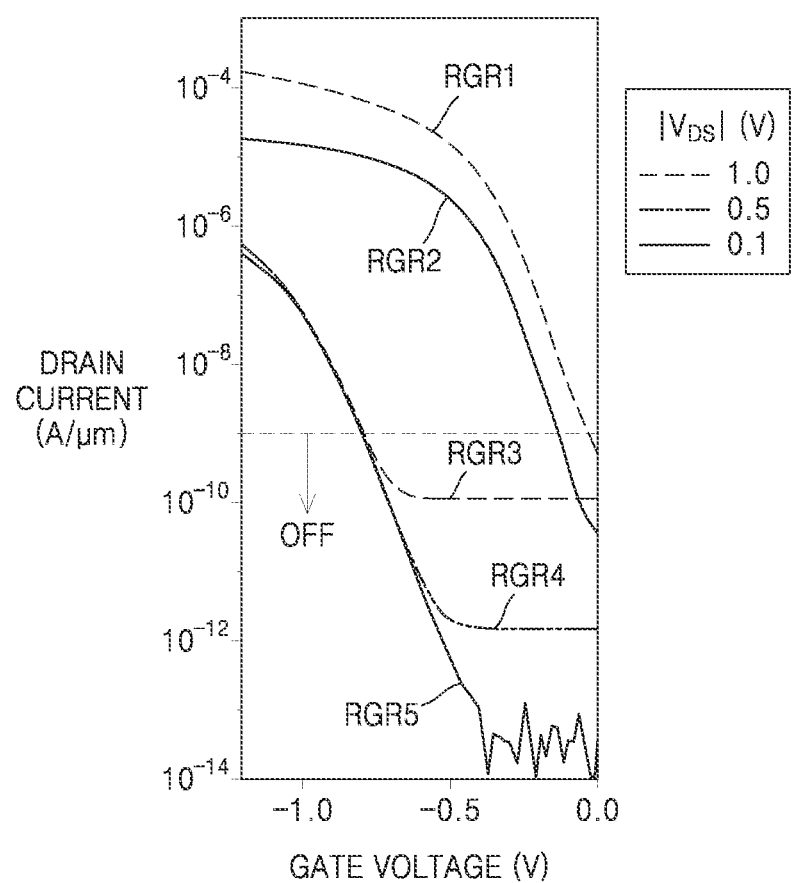
FIG. 4 shows gate voltage-drain current graphs of PMOS transistor devices of the present disclosure and conventional PMOS transistor devices.

FIG. 4 shows gate voltage-drain current graphs of PMOS transistor devices of the present disclosure and conventional PMOS transistor devices.

Referring to FIG. 4, gate voltage-drain current graphs PGR1 and PGR2 of the conventional PMOS transistor devices and gate voltage-drain current graphs PGR3, PGR4, and PGR5 of the PMOS transistor devices according to the present disclosure are illustrated.

Drain currents of the conventional PMOS transistor devices did not have a constant current component flowing regardless of a gate voltage.

Drain currents of the PMOS transistor devices of the present disclosure had a constant current component flowing regardless of a gate voltage. For example, even when the PMOS transistor devices of the present disclosure had an off state, a constant current flowed through the PMOS transistor devices of the present disclosure.

Figure 5:
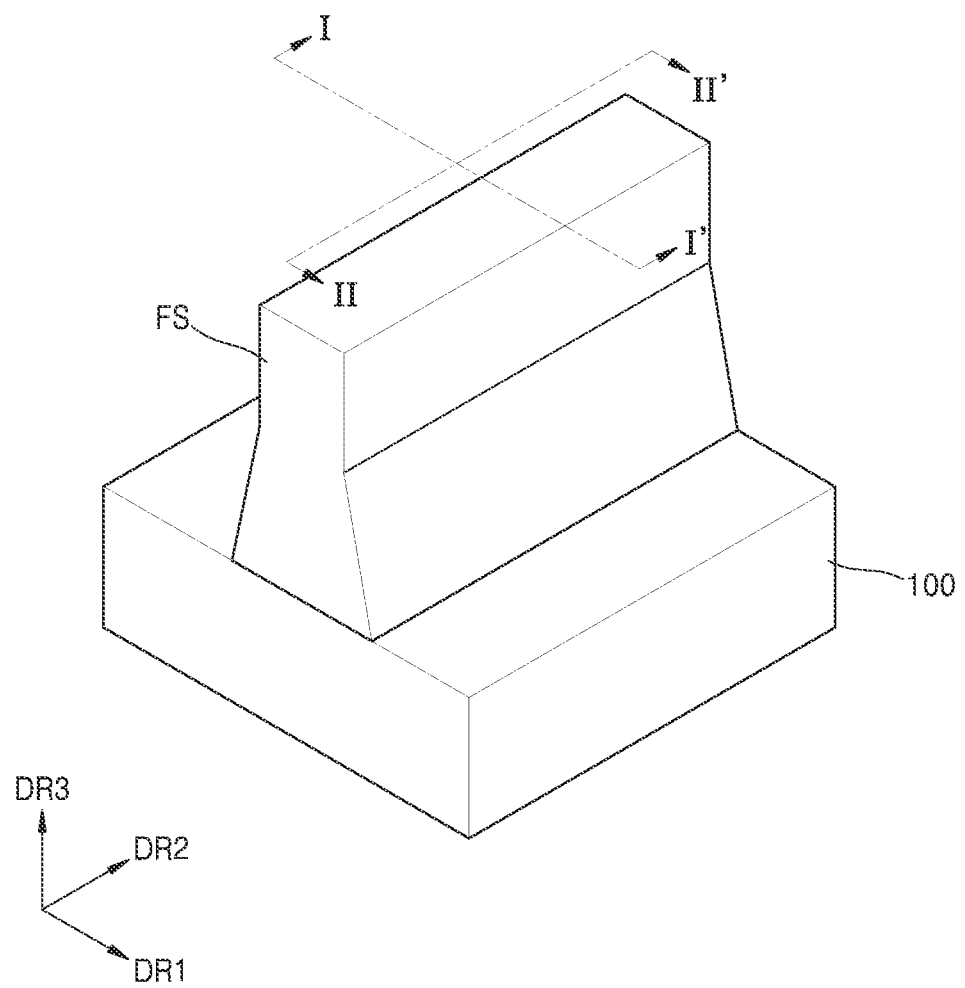
FIG. 5 is a perspective view for describing a method of manufacturing the transistor device of FIG. 1.
Figure 6:
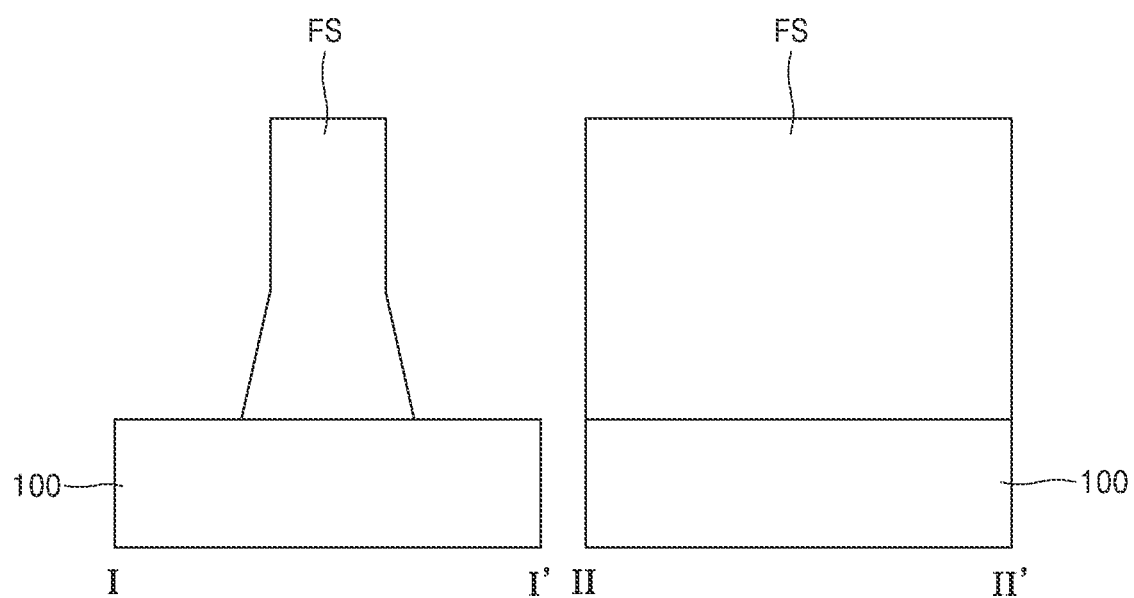
FIG. 6 is a cross-sectional view taken along lines I-I' and II-II' of FIG. 5.
Figure 7:
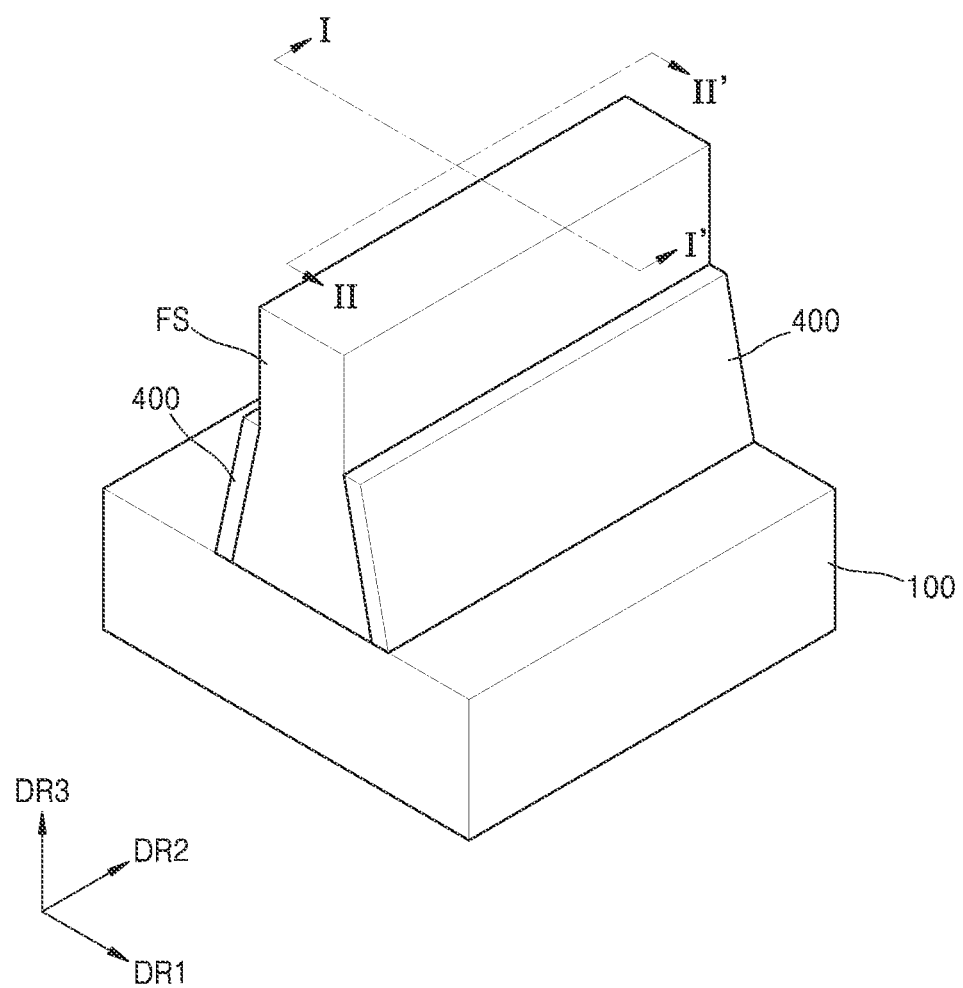
FIG. 7 is a perspective view for describing a method of manufacturing the transistor device of FIG. 1.
Figure 8:
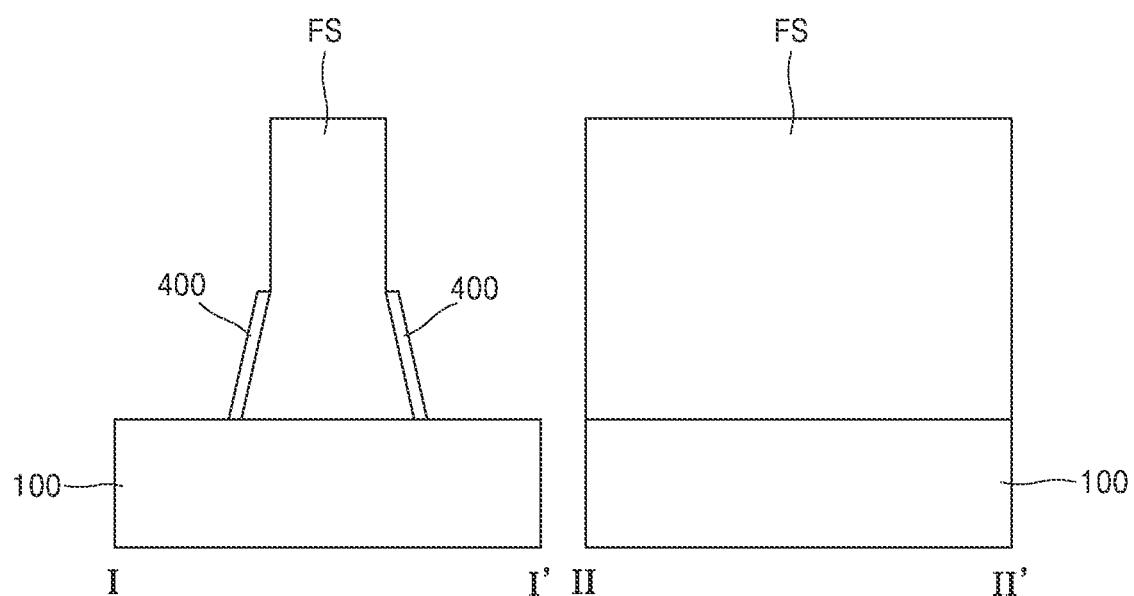
FIG. 8 is a cross-sectional view taken along lines I-I' and II-II' of FIG. 7.
Figure 9:
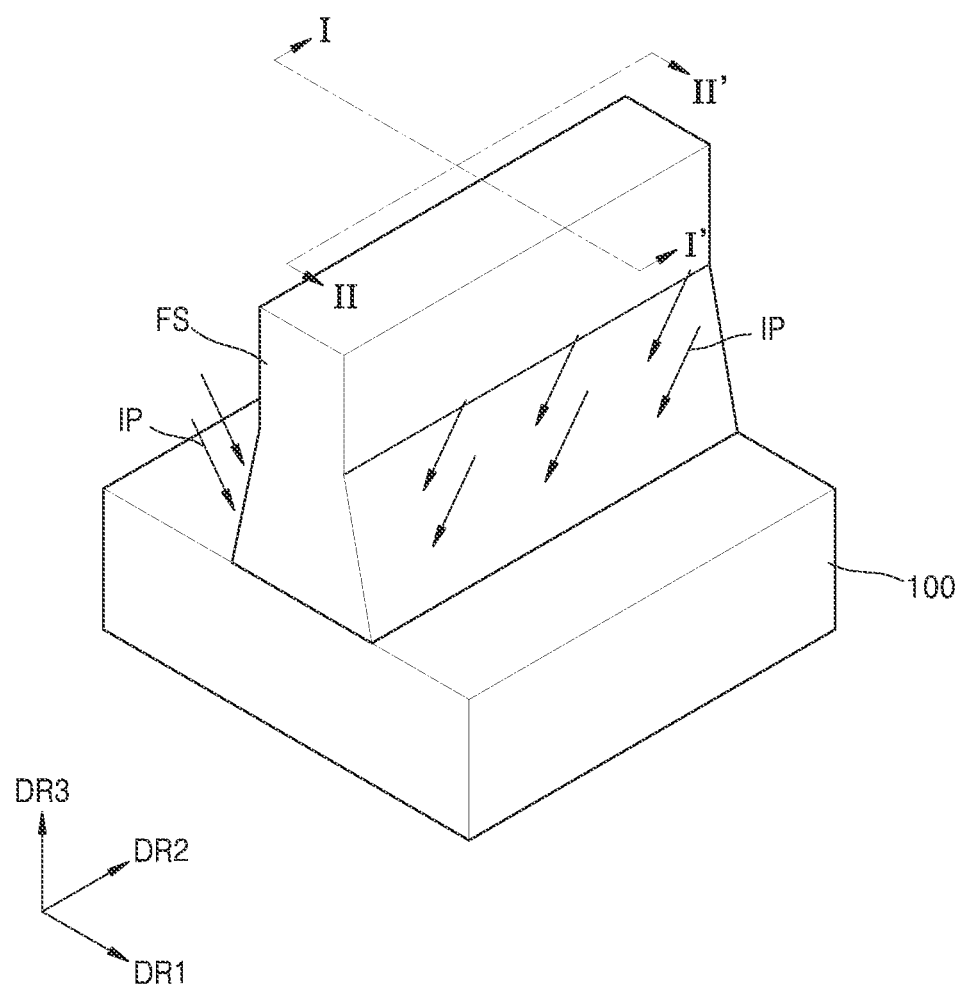
FIG. 9 is a perspective view for describing a method of manufacturing the transistor device of FIG. 1.
Figure 10:
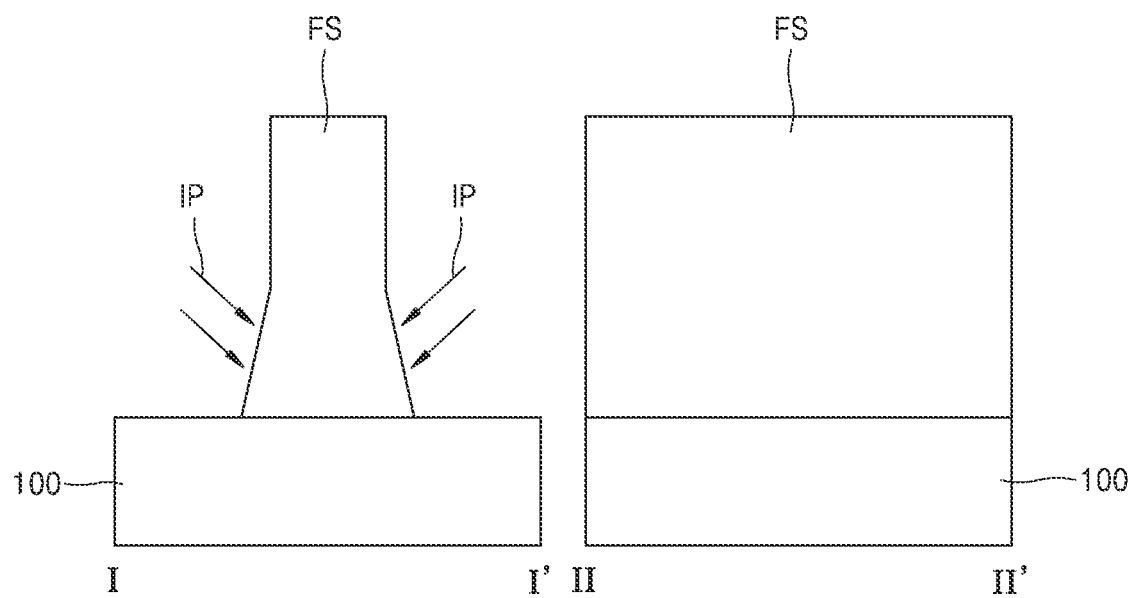
FIG. 10 is a cross-sectional view taken along lines I-I' and II-II' of FIG. 9.
Figure 11:
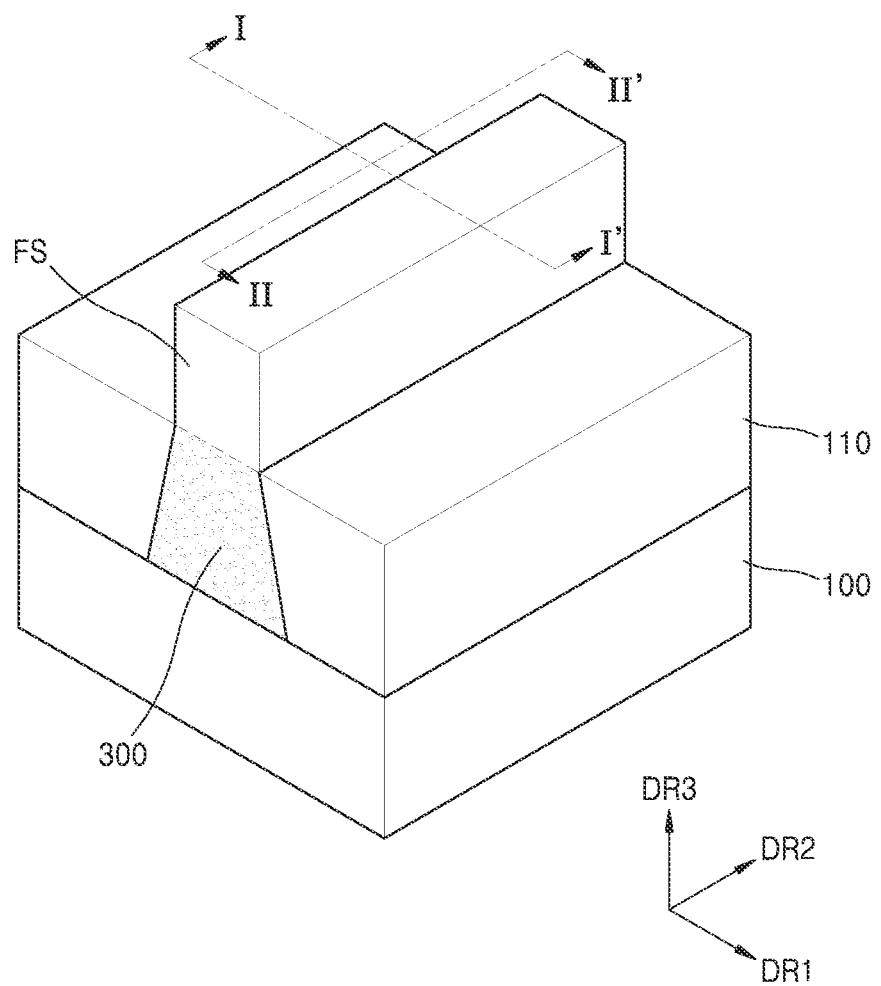
FIG. 11 is a perspective view for describing a method of manufacturing the transistor device of FIG. 1.
Figure 12:
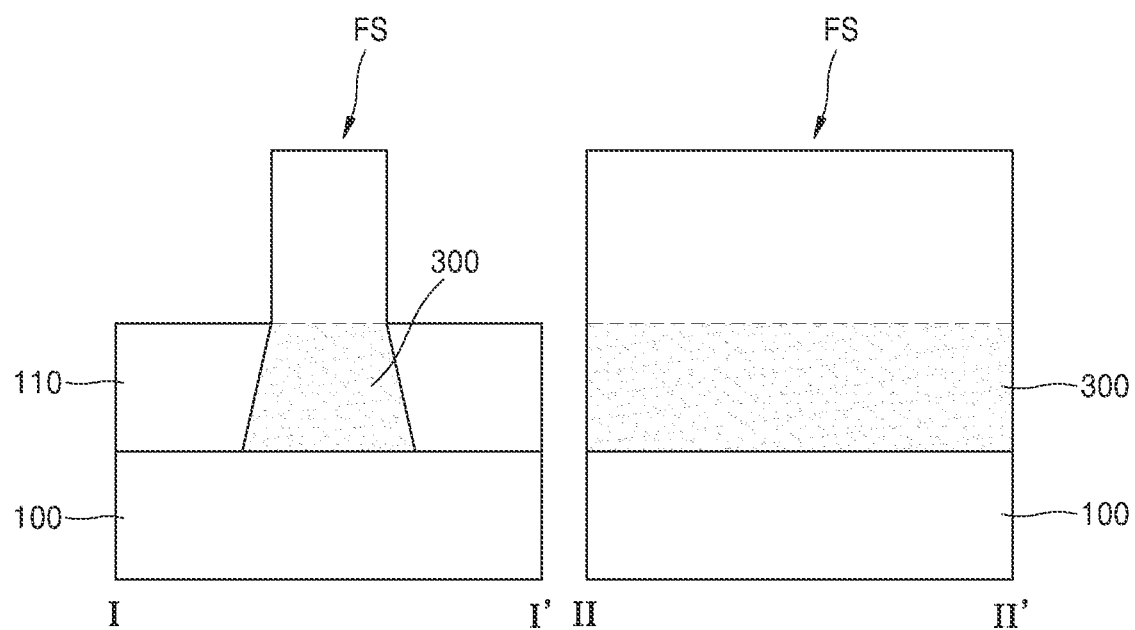
FIG. 12 is a cross-sectional view taken along lines I-I' and II-II' of FIG. 11.

FIG. 5 is a perspective view for describing a method of manufacturing the transistor device of FIG. 1. FIG. 6 is a cross-sectional view taken along lines and of FIG. 5. FIG. 7 is a perspective view for describing a method of manufacturing the transistor device of FIG. 1. FIG. 8 is a cross-sectional view taken along lines I-I' and II-II' of FIG. 7. FIG. 9 is a perspective view for describing a method of manufacturing the transistor device of FIG. 1. FIG. 10 is a cross-sectional view taken along lines I-I' and II-II' of FIG. 9. FIG. 11 is a perspective view for describing a method of manufacturing the transistor device of FIG. 1. FIG. 12 is a cross-sectional view taken along lines I-I' and II-II' of FIG. 11. For brevity of description, substantially the same descriptions as provided with reference to FIG. 1 may not be provided.

Referring to FIGS. 5 and 6, the fin structure FS may be formed on the substrate 100. Forming of the fin structure FS may include preparing a semiconductor layer (not shown) and patterning an upper portion of the semiconductor layer to expose the fin structure FS.

The semiconductor layer may be, for example, a silicon (Si) layer, a germanium (Ge) layer, or a silicon-germanium (SiGe) layer. The semiconductor film may have the first conductivity type. For example, the first conductivity type may be n-type or p-type. In the case where the conductivity type of the semiconductor layer is n-type, the semiconductor layer may include a group V element (e.g., P, As) as an impurity. In the case where the conductivity type of the semiconductor layer is p-type, the semiconductor layer may include a group III element (e.g., B, In) as an impurity.

For example, the patterning process may include forming a mask pattern on the semiconductor layer and performing an anisotropic etching process using the mask pattern as an etch mask on the semiconductor layer. The mask pattern may be removed during the anisotropic etching process or after the anisotropic etching process is completed.

Referring to FIGS. 7 to 12, an impurity may be implanted into the lower portion of the fin structure FS. A process of implanting the impurity may include, for example, a process of using an impurity film or an ion implantation (IP) process.

In one example, as illustrated in FIGS. 7 and 8, a pair of impurity films 400 may be formed on both sides of the lower portion of the fin structure FS, respectively. For example, each of the pair of impurity films 400 may include a boron silicate glass (BSG) film or a phosphorus silicate glass (PSG) film. The pair of impurity films 400 may be formed by a deposition process. The pair of impurity films 400 may expose the upper portion of the fin structure FS. In other words, the pair of impurity films 400 may not cover the upper portion of the fin structure FS.

In another example, as illustrated in FIGS. 9 and 10, an on implantation (IP) process may be performed under the fin structure FS. For example, an impurity implanted into the lower portion of the fin structure FS by the ion implantation (IP) process may be boron (B) or phosphorus (P).

Referring to FIGS. 11 and 12, the constant current generating layer 300 may be formed under the fin structure FS. In one example, forming of the constant current generating layer 300 may include a process of heat-treating the pair of impurity films 400 described with reference to FIGS. 7 and 8 to diffuse an impurity in the pair of impurity films 400 into the lower portion of the fin structure FS, and a process of removing the pair of impurity films 400 after the diffusion process is completed. In the case where the pair of impurity films 400 is BSG films, boron (B) may be implanted into the lower portion of the fin structure FS by the diffusion process. Accordingly, the conductivity type of the constant current generating layer 300 may be p-type. In the case where the pair of impurity films 400 is PSG films, phosphorus (P) may be implanted into the lower portion of the fin structure FS by the diffusion process. Accordingly, the conductivity type of the constant current generating layer 300 may be n-type. In another example, the constant current generating layer 300 may be formed by the ion implantation (IP) process described with reference to FIGS. 9 and 10.

The lower insulating film 110 may be formed on the substrate 100. Forming of the lower insulating film 110 may include a process of forming a deposition layer (not shown) by depositing an insulating material on the substrate 100, and a process of etching the deposition layer to expose the upper portion of the in structure FS. The deposition process may include a chemical vapor deposition process or a physical vapor deposition process. For example, the insulating material may include $SiO_2$ or a high-k dielectric material (e.g., SiON, $HfO_2$, $ZrO_2$).

Referring again to FIGS. 1 and 2, the gate insulating film 220 and the gate electrode 210 may be sequentially formed on the lower insulating film 110 and the fin structure FS. Forming of the gate insulating film 220 and the gate electrode 210 may include a process of forming a deposition layer (not shown) by sequentially depositing an insulating material and a conductive material on the lower insulating film 110 and the fin structure FS, and a process of exposing the upper portion of the fin structure FS by patterning the deposition layer. The deposition process may include a chemical vapor deposition process or a physical vapor deposition process. For example, the insulating material may include $SiO_2$ or a high-k dielectric material (e.g., SiON, $HfO_2$, $ZrO_2$). For example, the conductive material may include a metal (e.g., Cu) or doped-poly Si.

The pair of source/drain regions SD may be formed at portions exposed on both side surfaces of the gate electrode 210 of the fin structure FS, respectively. Forming of the pair of source/drain regions SD may include a process of doping the exposed upper portion of the fin structure FS. For example, the doping process may include an ion implantation process. The pair of source/drain regions SD may have a conductivity type different from the conductivity type of the constant current generating layer 300. In the case where the conductivity type of the constant current generating layer 300 is n-type, a group III element (e.g., B, In) may be implanted into the exposed upper portion of the fin structure FS. Accordingly, the conductivity type of the pair of source/drain regions SD may be p-type. In the case where the conductivity type of the constant current generating layer 300 is p-type, a group V element (e.g., P, As) may be implanted into the exposed upper portion of the fin structure FS. Accordingly, the conductivity type of the pair of source/drain regions SD may be n-type. Accordingly, the transistor device 10 having a constant current independent of a gate voltage may be formed.

In another example, the constant current generating layer 300 may be formed by an ion implantation process instead of a process using the pair of impurity films 400. The constant current generating layer 300 may be formed by implanting an impurity into the lower portion of the fin structure FS by using an ion implantation process. For example, the impurity may be boron (B) or phosphorus (P).

Figure 13:
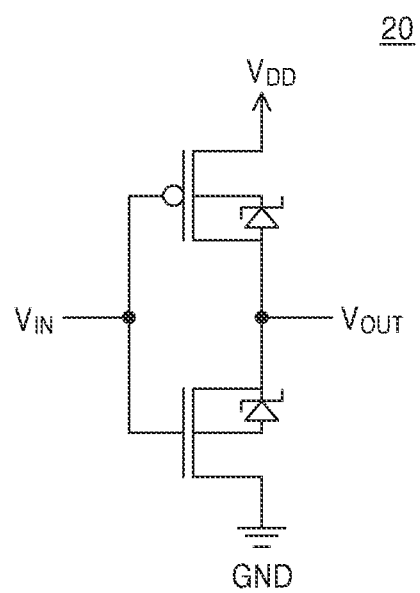
FIG. 13 is a circuit diagram of a ternary inverter device according to example embodiments.

FIG. 13 is a circuit diagram of a ternary inverter device according to example embodiments. For brevity of description, substantially the same descriptions as provided with reference to FIG. 1 and FIG. 2 may not be provided.

Referring to FIG. 13, a ternary inverter device 20 including an NMOS transistor device and a PMOS transistor device may be provided.

The NMOS transistor device may be the transistor device 10 described with reference to FIGS. 1 and 2, that has the p-type substrate 100, the p-type constant current generating layer 300, and the pair of n-type source/drain regions SD.

The PMOS transistor device may be the transistor device 10 having the n-type substrate 100, the n-type constant current generating layer 300, and the pair of p-type source/drain regions SD.

A ground voltage may be applied to a source and a substrate of the NMOS transistor device. For brevity of description, it is assumed that the ground voltage is 0 volt (V). A driving voltage $V_{DD}$ may be applied to a source and a substrate of the PMOS transistor device. An input voltage Vin may be applied to each of a gate electrode of the NMOS transistor device and a gate electrode of the PMOS transistor device.

A drain of the NMOS transistor may be electrically connected to a drain of the PMOS transistor, and such that they respectively have identical voltages. The voltages of the drain of the NMOS transistor device and the drain of the PMOS transistor device may be an output voltage Vout of the ternary inverter device 20.

A constant current may flow from the drain to the substrate of the NMOS transistor device. A constant current may flow from the substrate to the drain of the PMOS transistor device. The constant currents may be independent from the input voltage Vin.

In one example, a first input voltage may be applied to the gate electrode of the PMOS transistor device and the gate electrode of the NMOS transistor device, such that the PMOS transistor device has a constant current that is stronger than a channel current and the NMOS transistor device has a channel current that is stronger than a constant current. In this case, the output voltage Vout of the ternary inverter device 20 may be a first voltage.

In another example, a second input voltage may be applied to the gate electrode of the PMOS transistor device and the gate electrode of the NMOS transistor device, such that the NMOS transistor device has a constant current that is stronger than a channel current and the PMOS transistor device has a channel current that is stronger than a constant current. In this case, the output voltage of the ternary inverter device 20 may be a second voltage greater than the first voltage.

In another example, a third input voltage may be applied to the gate electrode of the PMOS transistor device and the gate electrode of the NMOS transistor device, such that each of the NMOS transistor device and the PMOS transistor device has a constant current that is stronger than a channel current. In this case, the output voltage of the ternary inverter device 20 may be a third voltage between the first voltage and the second voltage.

The constant current flowing from the drain to the substrate of the NMOS transistor device and the constant current flowing from the substrate to the drain of the PMOS transistor device may flow regardless of the gate voltages applied to the gate electrodes of the PMOS transistor device and the NMOS transistor device. A current in the ternary inverter device 20 may flow from the substrate of the PMOS transistor device to the substrate of the NMOS transistor device via the drain of the PMOS transistor device and the drain of the NMOS transistor device. The driving voltage $V_{DD}$ applied to the substrate of the PMOS transistor device may be divided by a resistance between the substrate of the PMOS transistor device and the drain of the PMOS transistor device, and a resistance between the substrate of the NMOS transistor device and the drain of the NMOS transistor device. The output voltage Vout may be a voltage to which a resistance between the substrate of the NMOS transistor device and the drain of the NMOS transistor device is applied. The output voltage Vout may have a value between the driving voltage $V_{DD}$ and 0 V.

The output voltage Vout may have 0 V (State '0'), a voltage between the driving voltage $V_{DD}$ and 0 V (State '1'), or the driving voltage $V_{DD}$ (State '2'), according to the input voltage Vin. The present disclosure; may provide a ternary inverter device; having three states according to the input voltage Vin.

Figure 14:
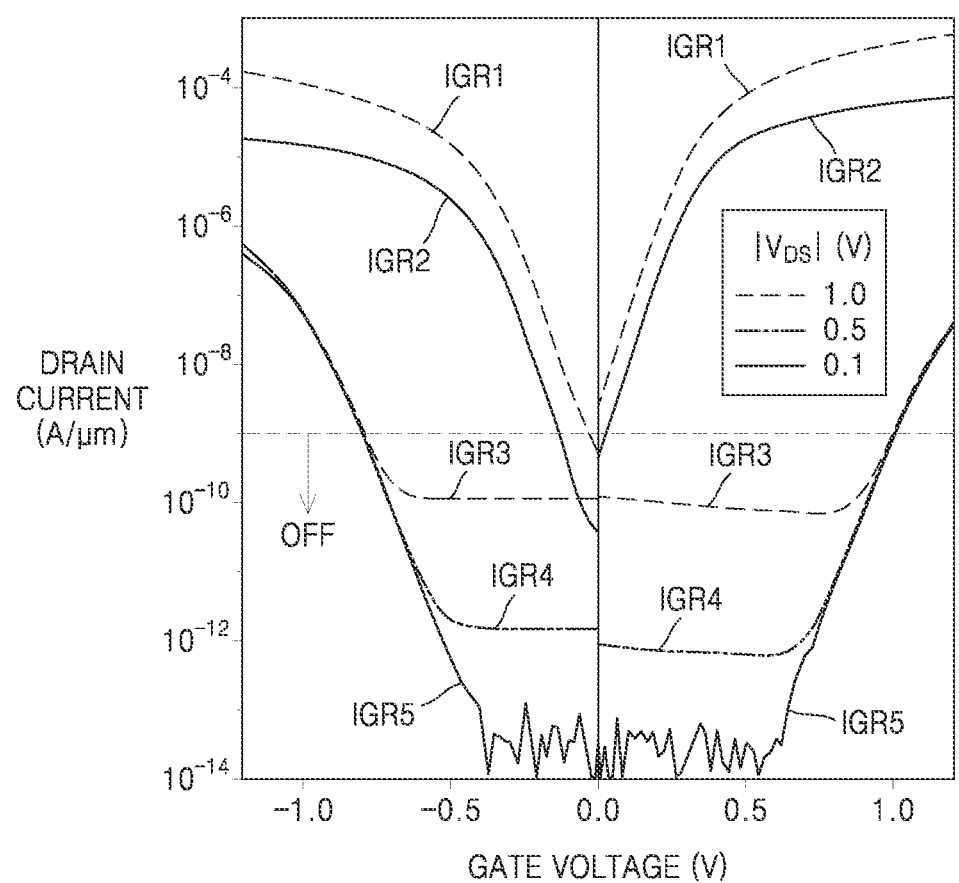
FIG. 14 shows gate voltage-drain current graphs of ternary inverter devices of the present disclosure and binary inverter devices.

FIG. 14 shows gate voltage-drain current graphs of ternary inverter devices of the present disclosure and binary inverter devices.

Referring to FIG. 14, gate voltage-drain current graphs IGR1 and IGR2 of the binary inverter devices and gate voltage-drain current graphs IGR3, IGR4, and IGR5 of the ternary inverter devices of the present disclosure are illustrated.

Drain currents of the binary inverter devices did not have a constant current component flowing regardless of a gate voltage.

Drain currents of the ternary inverter devices of the present disclosure had a constant current component flowing regardless of a gate voltage. For example, even when the ternary inverter devices of the present disclosure had an off state, a constant current flowed through the ternary inverter devices of the present disclosure.

Figure 15:
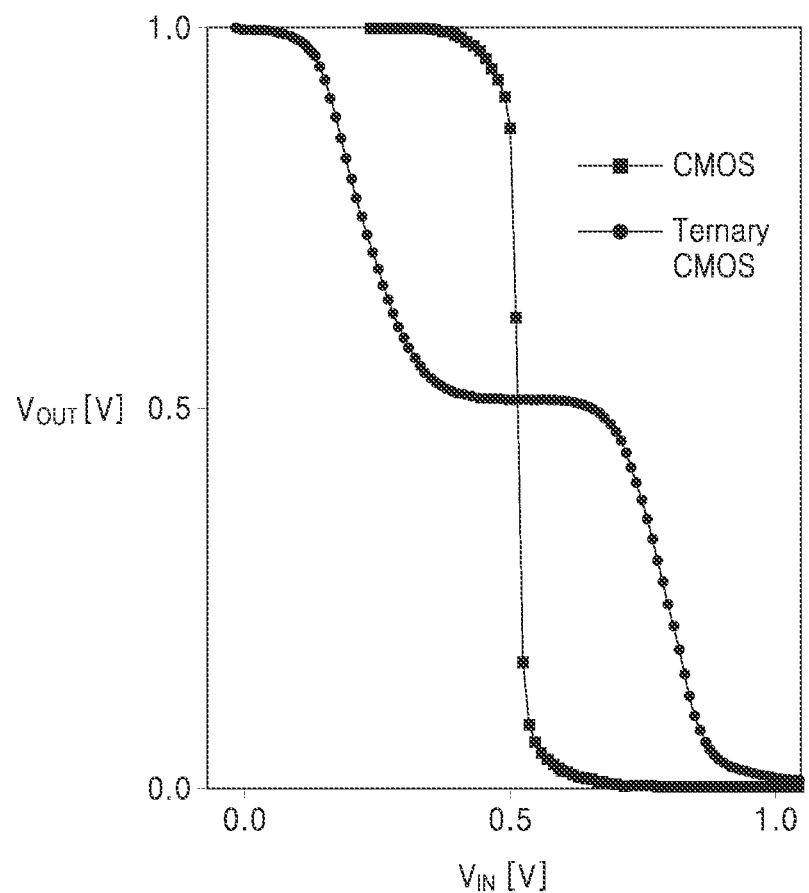
FIG. 15 shows an input voltage Vin-output voltage Vout graph of the ternary inverter device of the present disclosure and a binary inverter device.

FIG. 15 shows an input voltage Vin-output voltage Vout graph of the ternary inverter device of the present disclosure and a binary inverter device.

Referring to FIG. 15, the driving voltages $V_{DD}$ of the ternary inverter device of the present disclosure and the binary inverter device were 1.0 V, and a ground voltage GND was 0 V. The input voltages Vin of the ternary inverter device and the binary inverter device were 0 V to 1.0 V.

In the case of the binary inverter device, when the input voltage was changed from 0 V to 1 V, the output voltage Vout rapidly decreased from 1 V to 0 V in the vicinity of an input voltage of 0.5 V. That is, the binary inverter device has two states (e.g., State '0' and State '1').

In the case of the ternary inverter device of the present disclosure, when the input voltage was changed from 0 V to 1 V, the output voltage Vout rapidly decreased from 1 V to 0.5 V, then plateaued at 0.5 V, and then rapidly decreased from 0.5 V to 0 V once more. That is, the ternary inverter device of the present disclosure has three states (e.g., State '0', State '1', and State '2').

The above description of the embodiments of the spirit of the present disclosure provides examples for the description of the spirit of the present disclosure. Therefore, the spirit of the present disclosure is not limited to the above embodiments, and it is apparent that various modifications and changes may be made by one of ordinary skill in the art, within the spirit of the present disclosure, for example, by combining the above embodiments.

The invention claimed is:

1. A transistor device comprising:
   a substrate;
   a fin structure extending on the substrate in a direction parallel to a top surface of the substrate;
   a source region and a drain region provided at an upper portion of the fin structure;
   a constant current generating layer provided at a lower portion of the fin structure;
   a gate insulating film provided on both side surfaces and a top surface of the upper portion of the fin structure; and a gate electrode provided on the gate insulating film,
wherein the gate electrode is provided on the fin structure and between the source region and the drain region,
the substrate and the constant current generating layer have a first conductivity type,
the source region and the drain region have a second conductivity type that is different from the first conductivity type,
the constant current generating layer generates a constant current between the drain region and the substrate, and an electric field is formed between the drain region and the constant current generating layer, and
the constant current is independent from a gate voltage applied to the gate electrode.

2. The transistor device of claim 1, wherein the constant current generating layer is electrically connected to a lower portion of the source region and a lower portion of the drain region.

3. The transistor device of claim 1, wherein the constant current generating layer directly contacts a bottom surface of the source region and a bottom surface of the drain region.

4. The transistor device of claim 1, wherein a doping concentration of the constant current generating layer is $3 \times 10^{18}$ cm$^{-3}$ or greater.

5. The transistor device of claim 1, wherein
an intensity of the electric field is $10^6$ V/cm or greater.

6. A ternary inverter device comprising:
an NMOS transistor device; and
a PMOS transistor device,
wherein each of the NMOS transistor device and the PMOS transistor device comprises:
a substrate;
a fin structure extending on the substrate in a direction parallel to a top surface of the substrate;
a source region and a drain region provided at an upper portion of the fin structure; and
a constant current generating layer provided under the fin structure,
wherein the constant current generating layer directly contacts a lower portion of the source region and a lower portion of the drain region, and generates a constant current between the drain region and the substrate,
the drain region of the NMOS transistor device and the drain region of the PMOS transistor device have identical voltages, and
in each of the NMOS transistor device and the PMOS transistor device, the substrate and the constant current generating layer have a conductivity type identical to each other, and the source region and the drain region have another conductivity type identical to each other, and an electric field is formed between the drain region and the constant current generating layer.

7. The ternary inverter device of claim 6, wherein each of the NMOS transistor device and the PMOS transistor device further comprises:
a gate insulating film provided on both side surfaces and a top surface of the upper portion of the fin structure; and
a gate electrode provided on the gate insulating film, wherein the constant current is independent from a gate voltage applied to the gate electrode.

8. The ternary inverter device of claim 6, wherein
the drain region of the NMOS transistor device and the drain region of the PMOS transistor device
have a first voltage when the NMOS transistor device has a channel current that is stronger than the constant current and the PMOS transistor device has the constant current that is stronger than a channel current,
have a second voltage when the NMOS transistor device has the constant current that is stronger than the channel current and the PMOS transistor device has the channel current that is stronger than the constant current, and
have a third voltage when each of the NMOS transistor device and the PMOS transistor device has the constant current that is stronger than the channel current,
wherein the second voltage is greater than the first voltage, and
the third voltage has a value between the first voltage and the second voltage.

9. The ternary inverter device of claim 6, wherein in each of the NMOS transistor device and the PMOS transistor device, and a doping concentration of the constant current generating layer is greater than a doping concentration of the substrate.

10. The ternary inverter device of claim 6, wherein in each of the NMOS transistor device and the PMOS transistor device, a doping concentration of the constant current generating layer is $3 \times 10^{18}$ cm$^{-3}$ or greater.

11. A method of manufacturing a transistor device, the method comprising:
forming, on a substrate, a fin structure extending in a first direction;
forming a constant current generating layer at a lower portion of the fin structure;
forming, on the substrate, a gate electrode extending in a second direction that intersects the first direction;
forming a gate insulating film between the gate electrode and the fin structure; and
forming, on the fin structure, a source region and a drain region that are spaced apart from each other in the first direction,
wherein the constant current generating layer has a conductivity type identical to a conductivity type of the substrate,
the source region and the drain region are spaced apart from each other with the gate electrode therebetween, and
the forming of the constant current generating layer comprises:
forming a pair of impurity films on both sides of the lower portion of the fin structure, respectively; and
heat-treating the pair of impurity films.

12. The method of claim 11, wherein the pair of impurity films include a boron silicate glass (BSG) film or a phosphorus silicate glass (PSG) film.

13. The method of claim 11, wherein the forming of the constant current generating layer comprises:
implanting an impurity into the lower portion of the fin structure by using an ion implantation process.

* * * * *